(12) United States Patent
Huang et al.

(10) Patent No.: US 9,721,983 B2
(45) Date of Patent: Aug. 1, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chien-Chang Huang, Tainan (TW); Chien-Nan Tu, Kaohsiung (TW); Li-Ming Sun, Tainan (TW); Yu-Lung Yeh, Kaohsiung (TW); Yi-Ping Pan, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/713,773

(22) Filed: May 15, 2015

(65) Prior Publication Data

US 2016/0336365 A1    Nov. 17, 2016

(51) Int. Cl.
*H01L 27/146* (2006.01)

(52) U.S. Cl.
CPC .... *H01L 27/14621* (2013.01); *H01L 27/1463* (2013.01); *H01L 27/14629* (2013.01); *H01L 27/14645* (2013.01); *H01L 27/14649* (2013.01); *H01L 27/14685* (2013.01)

(58) Field of Classification Search
CPC ......... H01L 27/14621; H01L 27/14629; H01L 27/14685
USPC .......................................................... 257/432
See application file for complete search history.

(56) References Cited

U.S. PATENT DOCUMENTS

| | | | | |
|---|---|---|---|---|
| 2004/0021062 | A1* | 2/2004 | Zaidi | H01L 31/03528 250/214 R |
| 2007/0125935 | A1* | 6/2007 | Yaung | H01L 27/14621 250/208.1 |
| 2007/0242191 | A1* | 10/2007 | Yau | G02F 1/133606 349/106 |
| 2015/0116566 | A1* | 4/2015 | Yamamoto | H04N 5/367 348/308 |
| 2016/0086999 | A1* | 3/2016 | Mao | H01L 27/1463 257/432 |

* cited by examiner

*Primary Examiner* — Fernando L Toledo
*Assistant Examiner* — Adam S Bowen
(74) *Attorney, Agent, or Firm* — Maschoff Brennan

(57) ABSTRACT

A semiconductor device includes a carrier substrate, a first color filter, a first photodetector, and a light enhancement structure. The first photodetector is disposed between the carrier substrate and the first color filter. The light enhancement structure is disposed between the first color filter and the carrier substrate and adjacent to the first photodetector for enhancing intensity of light incident the first photodetector.

20 Claims, 9 Drawing Sheets

SEMICONDUCTOR DEVICE AND MANUFACTURING METHOD THEREOF

BACKGROUND

In semiconductor technologies, image sensors are used for sensing a volume of exposed light projected towards the semiconductor substrate. To do this, the image sensors use an array of pixels, or image sensor elements, to collect photo energy to convert images into electrical signals that can be used in a suitable application. The pixel responds to the light by accumulating a charge—the more light, the higher the charge. The charge can then be used by another circuit so that a color and brightness can be used for a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
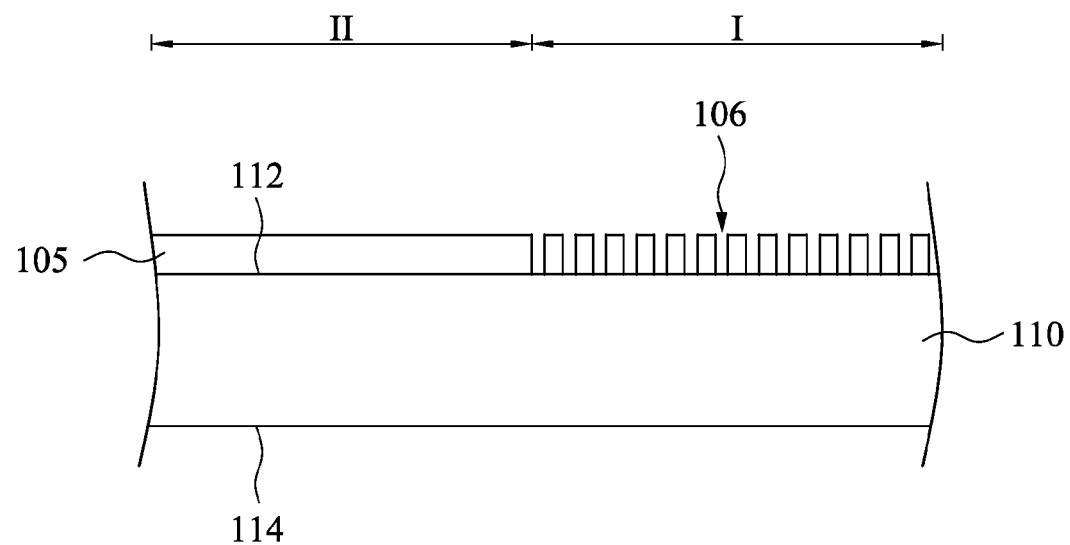
FIGS. 1A-1F are cross-sectional view of the method for forming a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1F are cross-sectional view of the method for forming a semiconductor device in accordance with various embodiments of the present disclosure. As shown in FIG. 1A, a substrate 110 is provided. The substrate 110 has a first main surface 112 and a second main surface 114 opposite to each other. The substrate 110 further has a first region I and a second region II. The substrate 110 is made of a semiconductor material, such as silicon.

Subsequently, a photoresist layer 105 is deposited over the first main surface 112 of the substrate 110. The photoresist layer 105 is then patterned to form a plurality of through holes 106 at the first region I of the substrate 110, such that portions of the first main surface 112 of the substrate 110 are exposed by the through holes 106.

Figure 1B:
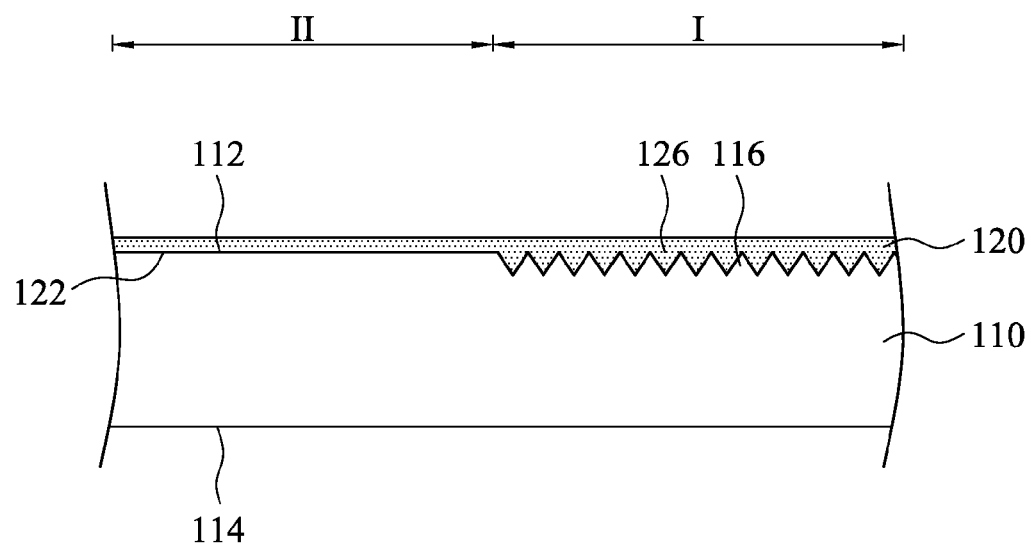

Reference is made to FIG. 1B. The substrate 110 is etched through the through holes 106 of the photoresist layer 105 (see FIG. 1A) to form a plurality of microstructures 116 at the first main surface 112 of the first region I of the substrate 110. Therefore, the first main surface 112 in the first region I is rougher than that in the second region II. In some embodiment, the first main surface 112 in the second region I is substantially flat. In some embodiments, the substrate 110 is anisotropic etched to form cone-shaped microstructures 116 (or bumps).

Then, the photoresist layer 105 (see FIG. 1A) is removed from the substrate 110 by, for example, ashing or stripping. Subsequently, a dielectric layer 120 is formed on the first main surface 112 of the substrate 110. The dielectric layer 120 may be made of oxide, and the dielectric layer 120 is formed by, for example, chemical vapor deposition (CVD). Then, the dielectric layer 120 is polished by, for example, a chemical-mechanical polishing (CMP) process. The polished dielectric layer 120 is referred as a light enhancement structure 120. Since the light enhancement structure 120 is disposed adjacent to and covers the first main surface 112 of the substrate 110, the light enhancement structure 120 includes a plurality of microstructures 126 on the first region I of the substrate 110. The microstructures 126 face the substrate 110. Furthermore, if the microstructures 116 are cone-shaped, the microstructures 126 are cone-shaped, too.

The light enhancement structure 120 has a surface 122 facing the substrate 110. The surface 122 corresponding to the first region I of the substrate 110 is rough and has a shape of the microstructures 126. The surface 122 corresponding to the second region II of the substrate 110 is substantially flat since there is no microstructures 126 formed thereof.

Figure 1C:
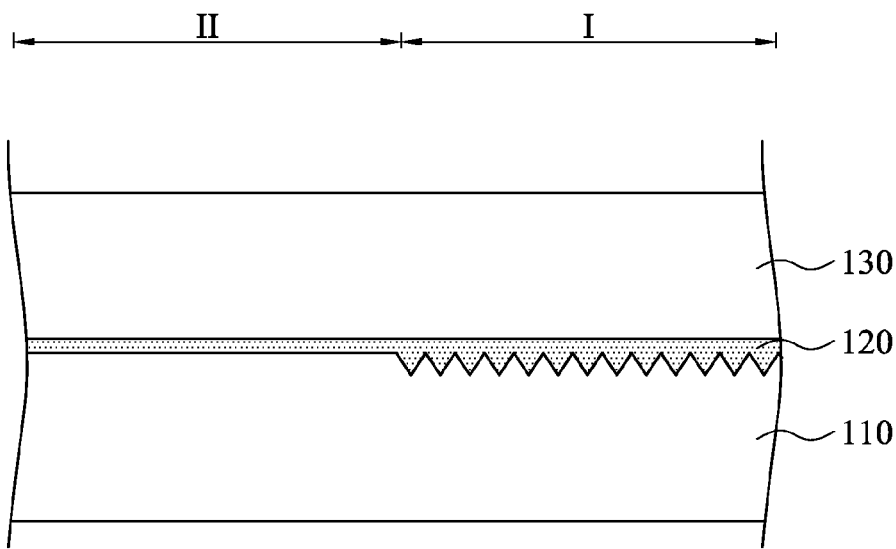

Reference is made to FIG. 1C. A carrier substrate 130 is formed on the light enhancement structure 120, such that the light enhancement structure 120 is disposed between the substrate 110 and the carrier substrate 130. The carrier substrate 130 can provide mechanical strength and support for subsequent processes. The carrier substrate 130 may includes any suitable material, such as silicon wafer and/or glass. In some embodiments, the carrier substrate 130 and structure in FIG. 1B are bonded together through a bonding process, such as a direct bonding process.

Figure 1D:
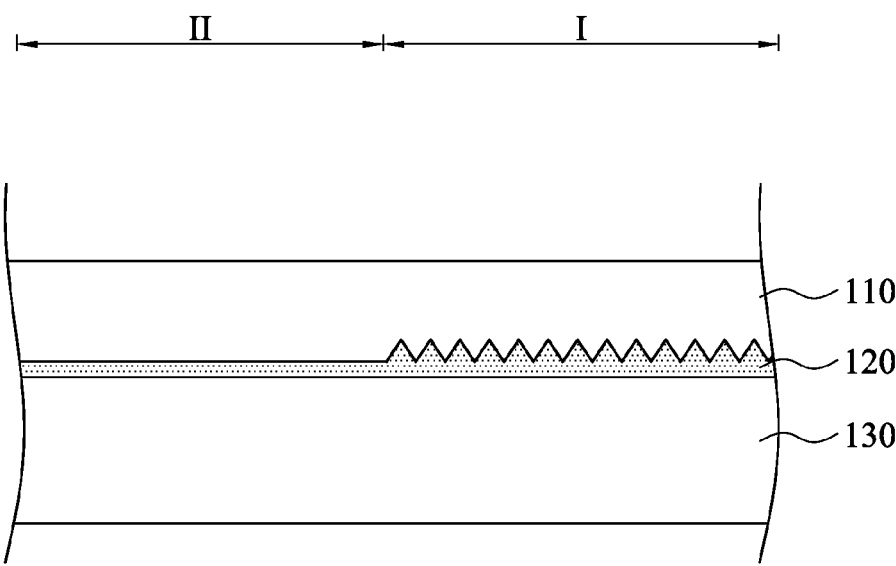

Reference is made to FIG. 1D. The bonded structure of FIG. 1C is flipped, and then the substrate 110 is thinned. The thinning process is, for example, mechanical grinding, chemical mechanical polishing (CMP), wet etching, atmospheric downstream plasma (ADP) dry chemical etching (DCE), or combinations thereof. In some embodiments, a substantial amount of substrate material is first removed from the substrate 110 by mechanical grinding. Afterwards, an etching chemical is applied onto the substrate 110 to further thin the substrate 110 to a desired thickness. In FIG. 1D, the microstructures 126 of the light enhancement structure 120 face upward.

Figure 1E:
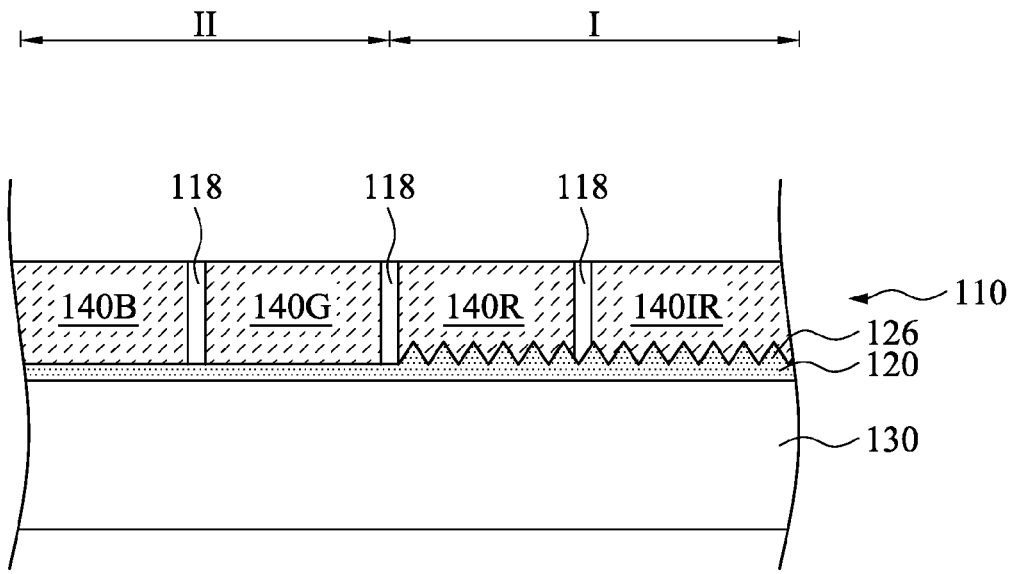

Reference is made to FIG. 1E. A plurality of photodetectors 140 are formed in the substrate 110. The photodetectors 140 are, for example, photodiodes, for recording an intensity or brightness of light. The photodiodes 140 may be doped regions having dopants formed in the substrate 110 by a method such as diffusion or ion implantation. In FIG. 1E, the doped regions are further labeled 140B, 140G, 140R, and 140IR to represent a blue photodetector, a green photodetector, a red photodetector, and an infrared photodetector, respectively. The blue photodetector 140B, the green photodetector 140G, the red photodetector 140R, and the infrared photodetector 140IR herein are photodetectors for sensing blue, green, red, and infrared light, respectively. It is note that the numbers of the blue photodetector 140B, the green photodetector 140G, the red photodetector 140R, and the infrared photodetector 140IR in FIG. 1E are illustrative, and should not limit the claimed scope of the present disclosure. In some other embodiments, the numbers of the blue photodetector 140B, the green photodetector 140G, the red photodetector 140R, and/or the infrared photodetector 140IR can be greater than one. Moreover, in order to prevent crosstalk between adjacent photodetectors, a plurality of isolation regions 118 are employed to enclose the photodetectors, and the photodetectors are referred as pixels.

In FIG. 1E, the red photodetector 140R and the infrared photodetector 140IR are disposed in the first region I of the substrate 110, and the blue photodetector 140B and the green photodetector 140G are disposed in the second region II of the substrate 110. Therefore, the red photodetector 140R and the infrared photodetector 140IR are adjacent to the microstructures 126 of the light enhancement structure 120, and the blue photodetector 140B and the green photodetector 140G are not adjacent to the microstructures 126 and the bottom sides thereof are substantially flat.

Figure 1F:
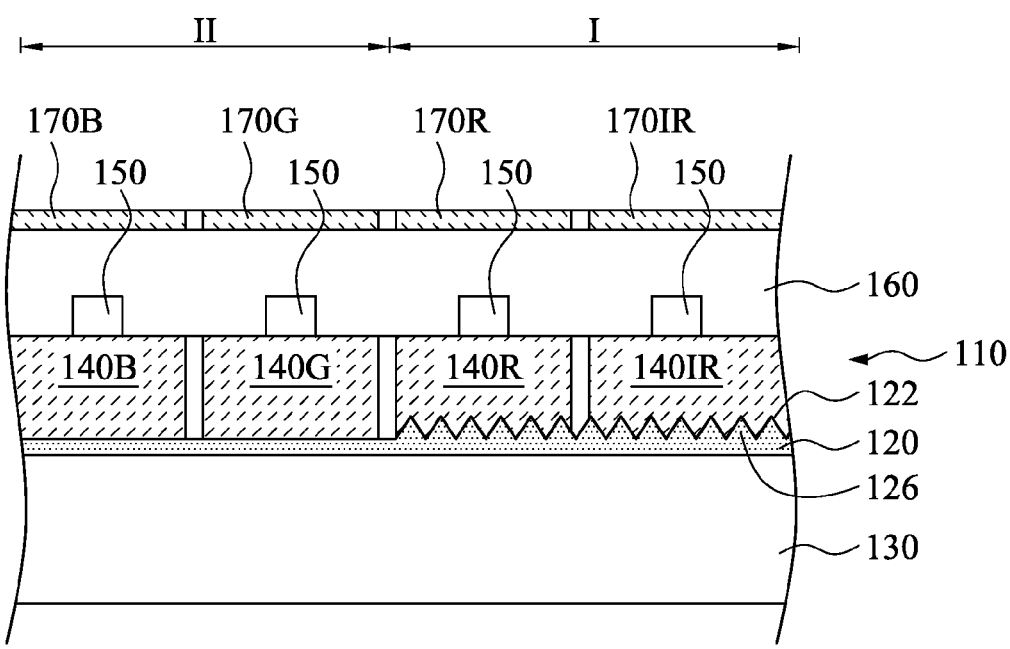

Reference is made to FIG. 1F. A plurality of active elements 150 are respectively formed on the photodetectors (i.e., the blue photodetector 140B, the green photodetector 140G, the red photodetector 140R, and the infrared photodetector 140IR). The active elements 150 are, for example, transistors. The active elements 150 are respectively and electrically connected to the photodetectors (i.e., the blue photodetector 140B, the green photodetector 140G, the red photodetector 140R, and the infrared photodetector 140IR). The active elements 150 and the light enhancement structure 120 are disposed at opposite sides of the photodetectors.

Subsequently, an interconnection layer 160 is formed on the active elements 150 and the photodetectors (i.e., the blue photodetector 140B, the green photodetector 140G, the red photodetector 140R, and the infrared photodetector 140IR). In some embodiments, the interconnection layer 160 includes at least one interlayer dielectric layer and at least one inter-metal dielectric layer. Furthermore, a plurality of electrical circuits (not shown) may be formed in the interconnection layer 160. The electrical circuits formed in the interconnection layer 160 may be any type of circuitry suitable for a particular application.

Subsequently, a plurality of color filters (i.e., a blue color filter 170B, a green color filter 170G, a red color filter 170R, and an infrared color filter 170IR) are formed on the interconnection layer 160. In FIG. 1F, the blue color filter 170B, the green color filter 170G, the red color filter 170R, and the infrared color filter 170IR are respectively aligned with the blue photodetector 140B, the green photodetector 140G, the red photodetector 140R, and the infrared photodetector 140IR. That is, the blue color filter 170B, the green color filter 170G, the red color filter 170R, and the infrared color filter 170IR respectively correspond to the blue photodetector 140B, the green photodetector 140G, the red photodetector 140R, and the infrared photodetector 140IR.

The color filters are made of a dye-based (or pigment based) polymer or resin for filtering a specific wavelength band of the incoming light, which corresponds to a color-spectrum (e.g. red, green, blue, yellow, cyan, infrared, or magenta). For example, the blue color filter 170B passes blue light (e.g. light with a transmission wavelength in a range from about 455 nm to about 495 nm) and reflects and/or absorbs light out of that range (e.g. green light, red light, or infrared light). Similarly, the green color filter 170G passes green light (e.g. light with a transmission wavelength in a range from about 495 nm to about 570 nm) and reflects and/or absorbs light out of that range (e.g. red light, infrared light, or blue light). The red color filter 170R passes red light (e.g. light with a transmission wavelength in a range from about 620 nm to about 780 nm) and reflects and/or absorbs light out of that range (e.g. blue light, green light, or infrared light). The infrared color filter 170IR passes infrared light (e.g. light with a transmission wavelength greater than about 780 nm) and reflects and/or absorbs light out of that range (e.g. visible light).

The terms "about" may be applied to modify any quantitative representation which could permissibly vary without resulting in a change in the basic function to which it is related. For example, the blue light as disclosed herein having a wavelength in a range from about 455 nm to about 495 nm may permissibly have a wavelength somewhat greater than 495 nm if its color is not substantially altered.

In FIG. 1F, the semiconductor device is a front-side illumination (FSI) complementary metal-oxide-semiconductor (CMOS) image sensor (CIS). The infrared photodetector 140IR is disposed between the carrier substrate 130 and the infrared color filter 170IR. The light enhancement structure 120 is disposed between the infrared color filter 170IR and the carrier substrate 130. Furthermore, the light enhancement structure 120 is disposed adjacent to the infrared photodetector 140IR and between the infrared photodetector 140IR and the carrier substrate 130. The light enhancement structure 120 is configured for enhancing intensity of light incident the infrared photodetector 140IR. In other words, the light enhancement structure 120 is configured for redirecting light to the infrared photodetector 140IR through reflection. A portion of the microstructures 126 of the light enhancement structure 120 overlap the infrared color filter 170IR and the infrared photodetector 140IR. One of the active elements 150 is disposed between the infrared color filter 170IR and the infrared photodetector 140IR.

Moreover, in FIG. 1F, the red photodetector 140R is disposed between the carrier substrate 130 and the red color filter 170R. The light enhancement structure 120 is disposed between the red color filter 170R and the carrier substrate 130. Furthermore, the light enhancement structure 120 is disposed adjacent to the red photodetector 140R and between the red photodetector 140R and the carrier substrate 130. The light enhancement structure 120 is configured for enhancing intensity of light incident the red photodetector 140IR. In other words, the light enhancement structure 120 is configured for redirecting light to the red photodetector 140R through reflection. Another portion of the microstructures 126 of the light enhancement structure 120 overlap the red color filter 170R and the red photodetector 140R. One of the active elements 150 is disposed between the red color filter 170R and the red photodetector 140R.

In greater detail, taking infrared light as examples, the infrared color filter 170IR filters incident light into infrared light, which is then incident the infrared photodetector 140IR. The infrared light has long penetrating path, such that a portion of the infrared light may passes through and leaves the infrared photodetector 140IR. However, in FIG. 1F, a reflective interface is formed between the light enhancement structure 120 and the infrared photodetector 140IR due to the reflective-index difference between the light enhancement structure 120 and the infrared photodetector 140IR. In some embodiments, the reflective index of the light enhancement structure 120 may be about 1.5, and the reflective index of the infrared photodetector 140IR (or the substrate 110) may be about 3.9. Furthermore, the microstructures 126 increase the area of the reflective interface. The transmission portion of the infrared light can be reflected by the microstructures 126 and back to the infrared photodetector 140IR. Therefore, the light intensity incident to the infrared photodetector 140IR can be enhanced, which increases the absorption of the infrared photodetector 140IR. Similarly, the microstructures 126 of the light enhancement structure 120 can enhance the light intensity incident to the red photodetector 140R. Since the physical details of red light are similar to the infrared light, and, therefore, a description in this regard will not be repeated hereinafter.

Moreover, in FIG. 1F, the green photodetector 140G is disposed between the carrier substrate 130 and the green color filter 170G. The light enhancement structure 120 is disposed between the green color filter 170G and the carrier substrate 130. Furthermore, the light enhancement structure 120 is disposed adjacent to the green photodetector 140G and between the green photodetector 140G and the carrier substrate 130. One of the active elements 150 is disposed between the green color filter 170G and the green photodetector 140G.

Furthermore, the blue photodetector 140B is disposed between the carrier substrate 130 and the blue color filter 170B. The light enhancement structure 120 is disposed between the blue color filter 170B and the carrier substrate 130. Furthermore, the light enhancement structure 120 is disposed adjacent to the blue photodetector 140B and between the blue photodetector 140B and the carrier substrate 130. One of the active elements 150 is disposed between the blue color filter 170B and the blue photodetector 140B.

In greater detail, taking green light as examples, the green color filter 170G filters incident light into green light, which is then incident the green photodetector 140G. The green light has short penetrating path, such that most of the green light can be absorbed by the green photodetector 140G. Therefore, the surface 122 of the light enhancement structure 120 adjacent to the green photodetector 140G can be flat to prevent the green light from leaking out of the surface 122. Similarly, the surface 122 of the light enhancement structure 120 adjacent to the blue photodetector 140B can be flat to prevent the blue light from leaking out of the surface 122. Since the physical details of blue light are similar to the green light, and, therefore, a description in this regard will not be repeated hereinafter.

Figure 2:
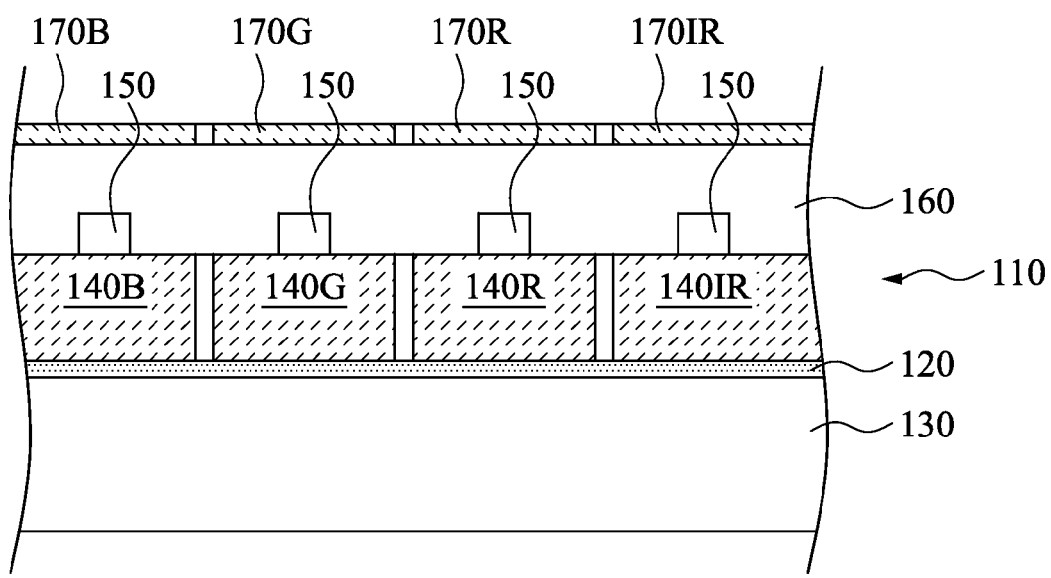
FIG. 2 is a cross-sectional view a semiconductor device in accordance with various embodiments of the present disclosure.

FIG. 2 is a cross-sectional view of a semiconductor device in accordance with various embodiments of the present disclosure. In FIG. 2, the light enhancement structure 120 is a reflector, such as a mirror. The reflector can reflect light passing through the photodetectors (i.e., the infrared photodetector 140IR, the red photodetector 140R, the green photodetector 140G, and the blue photodetector 140B) backward. Therefore, the light intensity incident the photodetectors can be enhanced, and the absorption amounts of light of the photodetectors are increased. Other relevant structural details in FIG. 2 are similar to the semiconductor device of FIG. 1F, and, therefore, a description in this regard will not be repeated hereinafter.

Figure 3A:
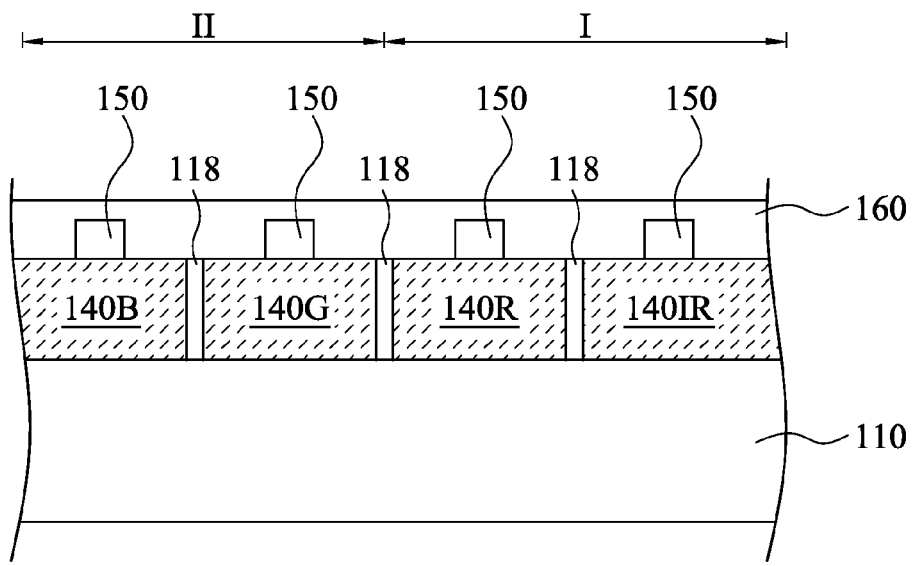
FIGS. 3A-3F are cross-sectional view of the method for forming a semiconductor device in accordance with various embodiments of the present disclosure.

FIGS. 3A-3F are cross-sectional view of the method for forming a semiconductor device in accordance with various embodiments of the present disclosure. As shown in FIG. 3A, a substrate 110 is provided. The substrate 110 has a first region I and a second region II. The substrate 110 is made of a semiconductor material, such as silicon.

Subsequently, a plurality of photodetectors 140 are formed in the substrate 110. The photodetectors 140 are, for example, photodiodes, for recording an intensity or brightness of light. The photodiodes 140 may be doped regions having dopants formed in the substrate 110 by a method such as diffusion or ion implantation. In FIG. 3A, the doped regions are further labeled 140B, 140G, 140R, and 140IR to represent a blue photodetector, a green photodetector, a red photodetector, and an infrared photodetector, respectively. The blue photodetector 140B, the green photodetector 140G, the red photodetector 140R, and the infrared photodetector 140IR herein are photodetectors for sensing blue, green, red, and infrared light, respectively. It is note that the numbers of the blue photodetector 140B, the green photodetector 140G, the red photodetector 140R, and the infrared photodetector 140IR in FIG. 3A are illustrative, and should not limit the claimed scope of the present disclosure. In some other embodiments, the numbers of the blue photodetector 140B, the green photodetector 140G, the red photodetector 140R, and/or the infrared photodetector 140IR can be greater than one. Moreover, in order to prevent crosstalk between adjacent photodetectors, a plurality of isolation regions 118 are employed to enclose the photodetectors, and the photodetectors are referred as pixels.

In FIG. 3A, the red photodetector 140R and the infrared photodetector 140IR are disposed in the first region I of the substrate 110, and the blue photodetector 140B and the green photodetector 140G are disposed in the second region II of the substrate 110.

Then, a plurality of active elements 150 are respectively formed on the photodetectors (i.e., the blue photodetector 140B, the green photodetector 140G, the red photodetector 140R, and the infrared photodetector 140IR). The active elements 150 are, for example, transistors. The active elements 150 are respectively and electrically connected to the photodetectors (i.e., the blue photodetector 140B, the green photodetector 140G, the red photodetector 140R, and the infrared photodetector 140IR).

Subsequently, an interconnection layer 160 is formed on the active elements 150 and the photodetectors (i.e., the blue photodetector 140B, the green photodetector 140G, the red photodetector 140R, and the infrared photodetector 140IR). In some embodiments, the interconnection layer 160 includes at least one interlayer dielectric layer and at least one inter-metal dielectric layer. Furthermore, a plurality of electrical circuits (not shown) may be formed in the interconnection layer 160. The electrical circuits formed in the interconnection layer 160 may be any type of circuitry suitable for a particular application.

Figure 3B:
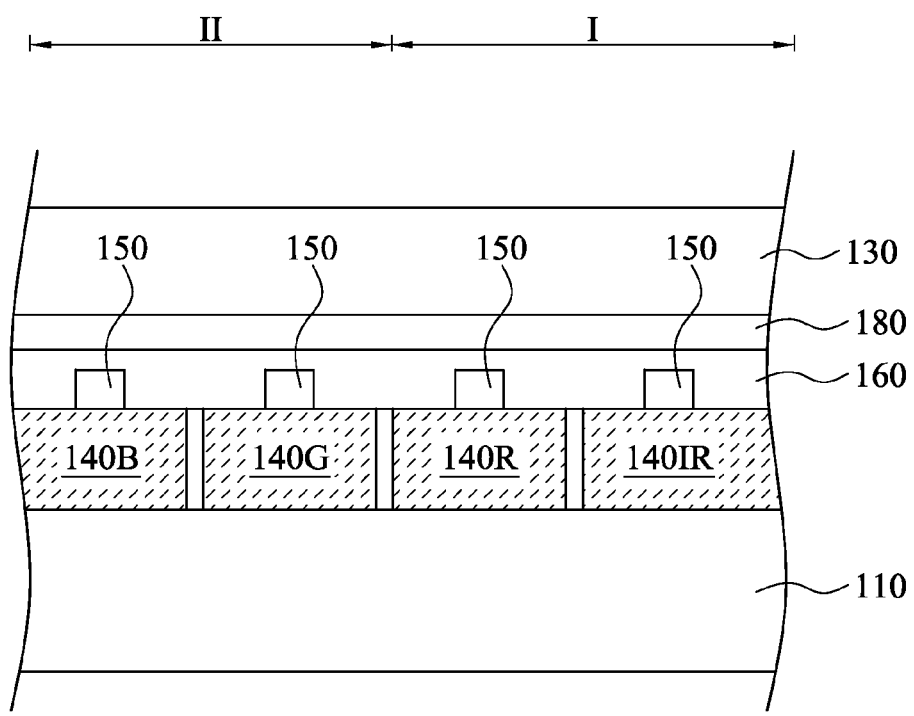

Reference is made to FIG. 3B. A dielectric layer 180 is formed on the interconnection layer 160. The dielectric layer 160 may be made of oxide, and the dielectric layer 180 is formed by, for example, chemical vapor deposition (CVD). Subsequently, a carrier substrate 130 is formed on the dielectric layer 180, such that the dielectric layer 180 is disposed between the substrate 110 and the carrier substrate 130, or, disposed between the carrier substrate 130 and the interconnection layer 160. The carrier substrate 130 can provide mechanical strength and support for subsequent processes. The carrier substrate 130 may includes any suitable material, such as silicon wafer and/or glass. In some embodiments, the carrier substrate 130 and structure in FIG. 3A are bonded together through a bonding process, such as a direct bonding process.

Figure 3C:
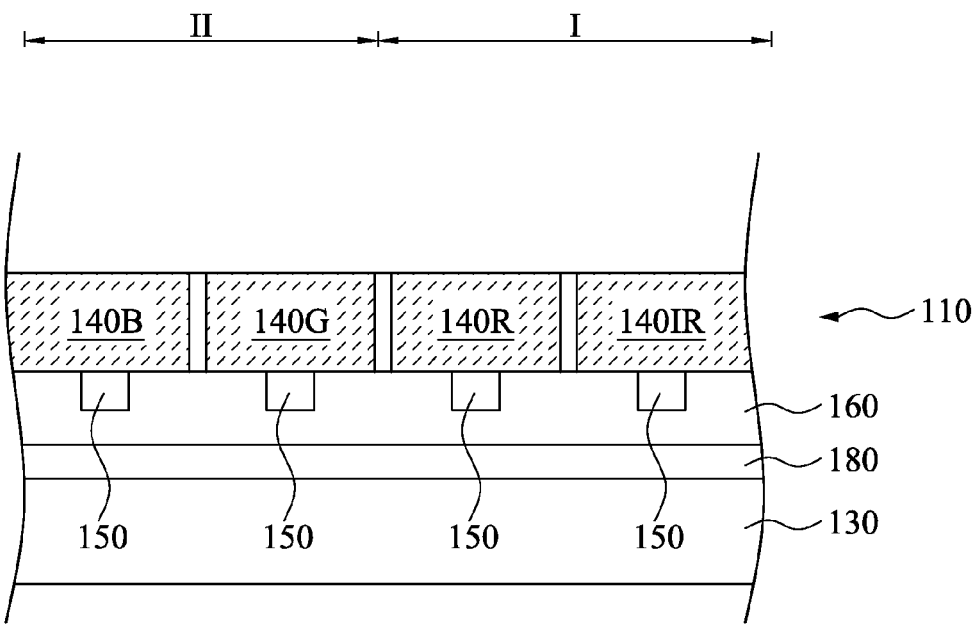

Reference is made to FIG. 3C. The bonded structure of FIG. 3B is flipped, and then the substrate 110 is thinned. The thinning process is, for example, mechanical grinding, chemical mechanical polishing (CMP), wet etching, atmospheric downstream plasma (ADP) dry chemical etching (DCE), or combinations thereof. In some embodiments, a substantial amount of substrate material is first removed from the substrate 110 by mechanical grinding. Afterwards, an etching chemical is applied onto the substrate 110 to further thin the substrate 110 to expose the photodetectors (i.e., the blue photodetector 140B, the green photodetector 140G, the red photodetector 140R, and the infrared photodetector 140IR).

Figure 3D:
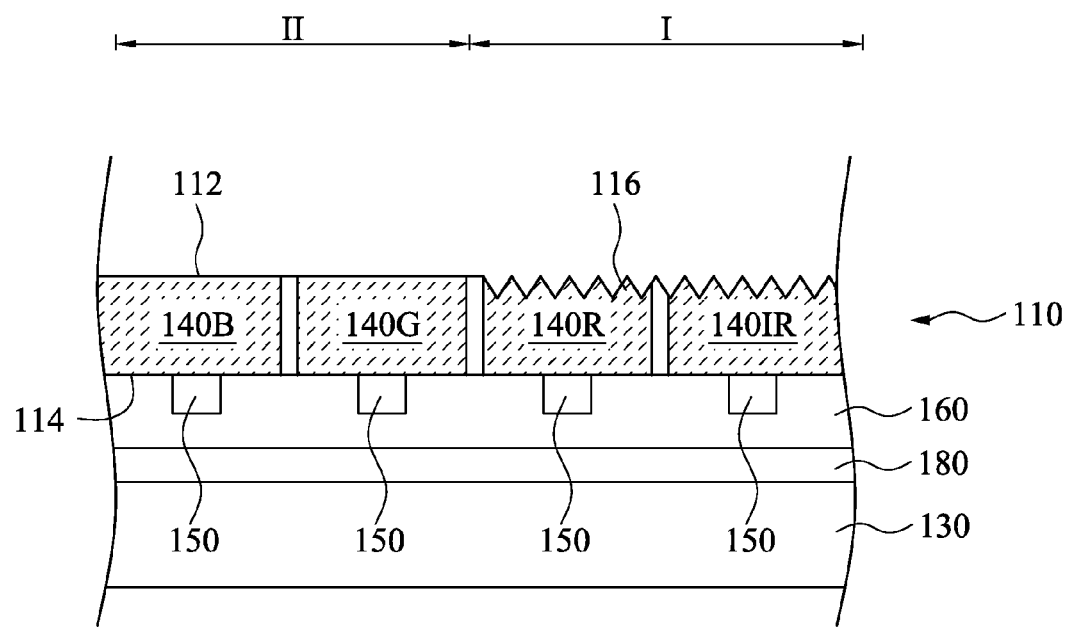

Reference is made to FIG. 3D. Subsequently, a plurality of microstructures 116 are formed at a first main surface 112 in the first region I of the substrate 110. For example, a patterned photoresist layer (not shown) can be form on first main surface 112 of the substrate 110 in advance, and the substrate 110 is etched through the patterned photoresist layer to form the microstructures 116. Then, the photoresist layer is removed from the substrate 110 by, for example, ashing or stripping. Therefore, the first main surface 112 in the first region I is rougher than that in the second region II. In some embodiment, the first main surface 112 in the second region II is substantially flat. In some embodiments, the substrate 110 is anisotropic etched to form cone-shaped microstructures 116 (or bumps). The substrate 110 further has a second main surface 114 opposite to the first main surface 112, and the second main surface 114 is adjacent to the active elements 150.

Figure 3E:
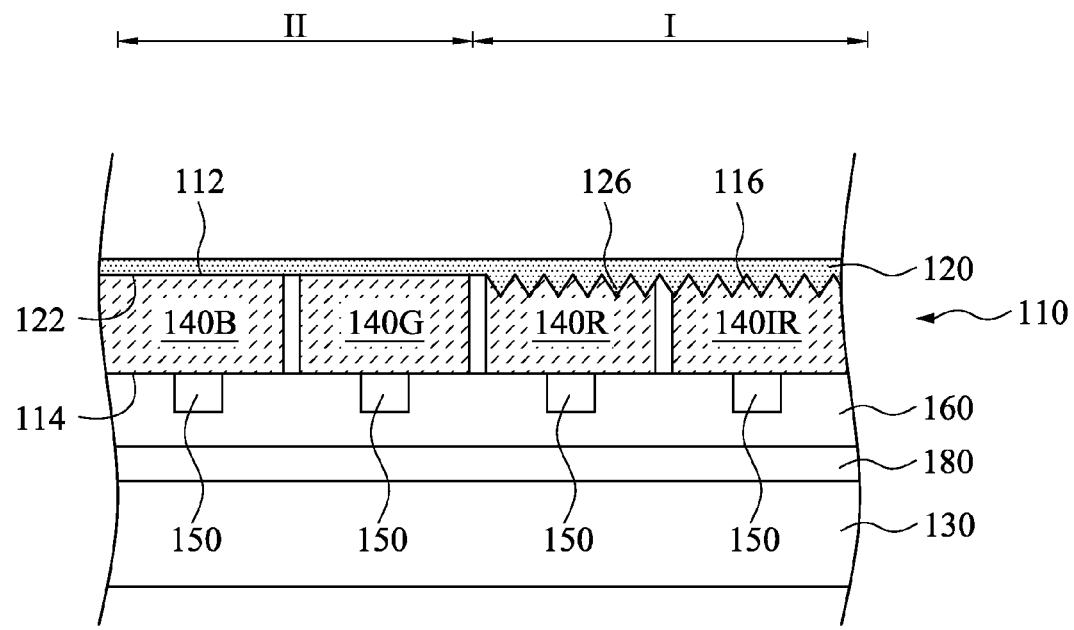

Reference is made to FIG. 3E. A dielectric layer 120 is formed on the first main surface 112 of the substrate 110. The dielectric layer 120 may be made of oxide, and the dielectric layer 120 is formed by, for example, chemical vapor deposition (CVD). Then, the dielectric layer 120 is polished by, for example, a chemical-mechanical polishing (CMP) process. The polished dielectric layer 120 is referred as a light enhancement structure 120. The light enhancement structure 120 and the active elements 150 are disposed at opposite sides of the photodetectors. Since the light enhancement structure 120 is disposed adjacent to and covers the first main surface 112 of the substrate 110, the light enhancement structure 120 includes a plurality of microstructures 126 on the first region I of the substrate 110. The microstructures 126 face the substrate 110. Furthermore, if the microstructures 116 are cone-shaped, the microstructures 126 are cone-shaped, too.

The light enhancement structure 120 has a surface 122 facing the substrate 110 (or the photodetectors). The surface 122 corresponding to the first region I of the substrate 110 is rough and has a shape of the microstructures 126. The surface 122 corresponding to the second region II of the substrate 110 is substantially flat since there is no microstructures 126 formed thereof. The red photodetector 140R and the infrared photodetector 140IR are adjacent to the microstructures 126 of the light enhancement structure 120, and the blue photodetector 140B and the green photodetector 140G are not adjacent to the microstructures 126 and the top sides thereof are substantially flat.

Figure 3F:
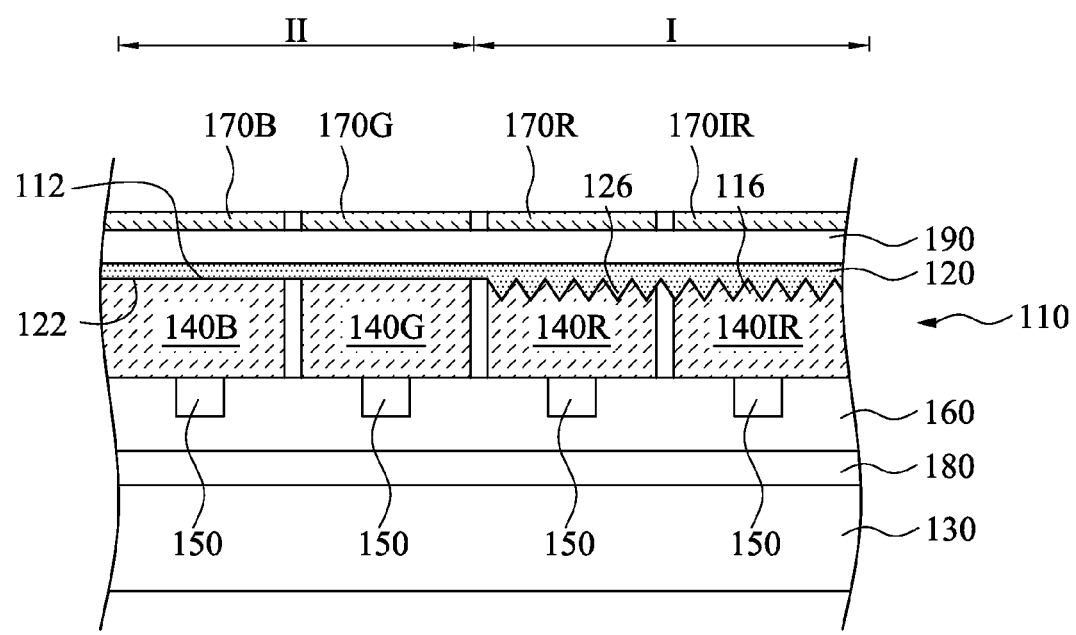

Reference is made to FIG. 3F. A passivation layer 190 is formed on the light enhancement structure 120. The passivation layer 190 may be made of oxide, and the passivation layer 190 is formed by, for example, chemical vapor deposition (CVD). Subsequently, a plurality of color filters (i.e., a blue color filter 170B, a green color filter 170G, a red color filter 170R, and an infrared color filter 170IR) are formed on the passivation layer 190. In FIG. 3F, the blue color filter 170B, the green color filter 170G, the red color filter 170R, and the infrared color filter 170IR are respectively aligned with the blue photodetector 140B, the green photodetector 140G, the red photodetector 140R, and the infrared photodetector 140IR. That is, the blue color filter 170B, the green color filter 170G, the red color filter 170R, and the infrared color filter 170IR respectively correspond to the blue photodetector 140B, the green photodetector 140G, the red photodetector 140R, and the infrared photodetector 140IR.

In FIG. 3F, the semiconductor device is a backside illumination (BSI) complementary metal-oxide-semiconductor (CMOS) image sensor (CIS). The infrared photodetector 140IR is disposed between the carrier substrate 130 and the infrared color filter 170IR. The light enhancement structure 120 is disposed between the infrared color filter 170IR and the carrier substrate 130. Moreover, the light enhancement structure 120 is disposed adjacent to the infrared photodetector 140IR and between the infrared color filter 170IR and the infrared photodetector 140IR. The light enhancement structure 120 is configured for enhancing intensity of light incident the infrared photodetector 140IR. In other words, light enhancement structure 120 is configured for redirecting light to the infrared photodetector 140IR through reflection. A portion of the microstructures 126 of the light enhancement structure 120 overlap the infrared color filter 170IR and the infrared photodetector 140IR. One of the active elements 150 is disposed between the infrared photodetector 140IR and the carrier substrate 130.

Moreover, the red photodetector 140R is disposed between the carrier substrate 130 and the red color filter 170R. The light enhancement structure 120 is disposed between the red color filter 170R and the carrier substrate 130. Moreover, the light enhancement structure 120 is disposed adjacent to the red photodetector 140R and between the red color filter 170R and the red photodetector 140R. The light enhancement structure 120 is configured for enhancing intensity of light incident the red photodetector 140R. In other words, light enhancement structure 120 is configured for redirecting light to the red photodetector 140R through reflection. Another portion of the microstructures 126 of the light enhancement structure 120 overlap the red color filter 170R and the red photodetector 140R. One of the active elements 150 is disposed between the red photodetector 140R and the carrier substrate 130.

In greater detail, taking infrared light as examples, the infrared color filter 170IR filters incident light into infrared light, which is then incident the infrared photodetector 140IR. A reflective interface is formed between the light enhancement structure 120 and the infrared photodetector 140IR due to the reflective-index difference between the light enhancement structure 120 and the infrared photodetector 140IR. In some embodiments, the reflective index of the light enhancement structure 120 may be about 1.5, and the reflective index of the infrared photodetector 140IR (or the substrate 110) may be about 3.9. Furthermore, the microstructures 126 deflect the propagation path of the infrared light. A portion of the infrared light is incident the microstructure 126 and is reflected by the microstructures 126. The reflected light can be deflected to other microstructures 126 and go through multiple reflections. Assume the reflectivity of the surface 122 is X %, wherein 0<X<1. After n times reflections, the reflectivity of the infrared light drops to $X^n$ %. Therefore, the light intensity incident to the infrared photodetector 140IR can be enhanced, which increases the absorption of the infrared photodetector 140IR. Similarly, the microstructures 126 enhance light intensity incident to the red photodetector 140R. Since the physical details of red light are similar to the infrared light, and, therefore, a description in this regard will not be repeated hereinafter.

Furthermore, the green photodetector 140G is disposed between the carrier substrate 130 and the green color filter 170G. The light enhancement structure 120 is disposed between the green color filter 170G and the carrier substrate 130. Furthermore, the light enhancement structure 120 is disposed adjacent to the green photodetector 140G and between the green color filter 170G and the green photodetector 140G. One of the active elements 150 is disposed between the green photodetector 140G and the carrier substrate 130.

Moreover, the blue photodetector 140B is disposed between the carrier substrate 130 and the blue color filter 170B. The light enhancement structure 120 is disposed between the blue color filter 170B and the carrier substrate 130. Furthermore, the light enhancement structure 120 is disposed adjacent to the blue photodetector 140B and between the blue color filter 170B and the blue photodetector 140B. One of the active elements 150 is disposed between the blue photodetector 140B and the carrier substrate 130.

Figure 4:
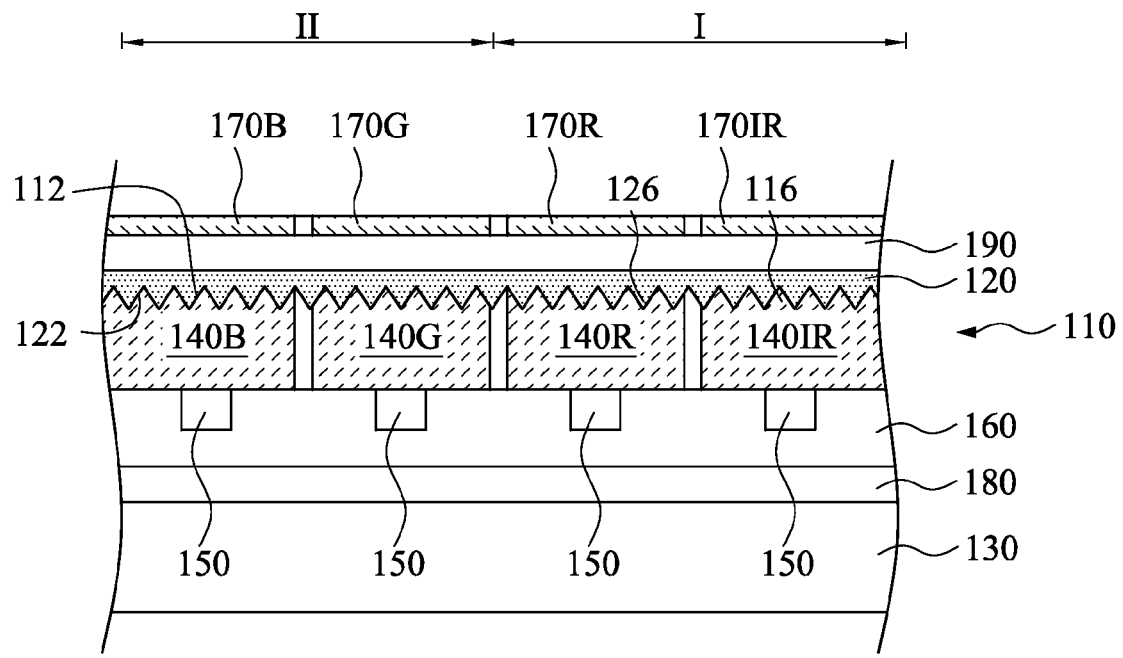
FIG. 4 is a cross-sectional view a semiconductor device in accordance with various embodiments of the present disclosure.

FIG. 4 is a cross-sectional view of a semiconductor device in accordance with various embodiments of the present disclosure. In FIG. 4, the microstructures 126 of the light enhancement structure 120 are disposed both on the first region I and the second region II of the substrate 110. Therefore, the light intensity incident the photodetectors can be all enhanced, and the absorption amounts of light of the photodetectors are all increased. Other relevant structural details in FIG. 4 are similar to the semiconductor device of FIG. 3F, and, therefore, a description in this regard will not be repeated hereinafter.

Figure 5:
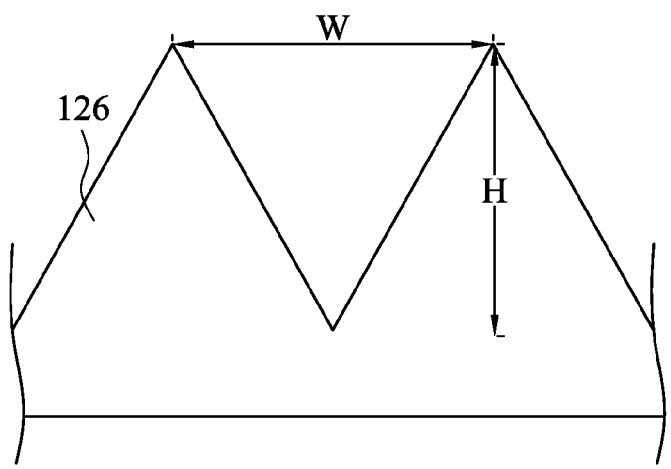
FIG. 5 is an enlarged cross-sectional view of a microstructure in accordance with various embodiments of the present disclosure.
Figure 6:
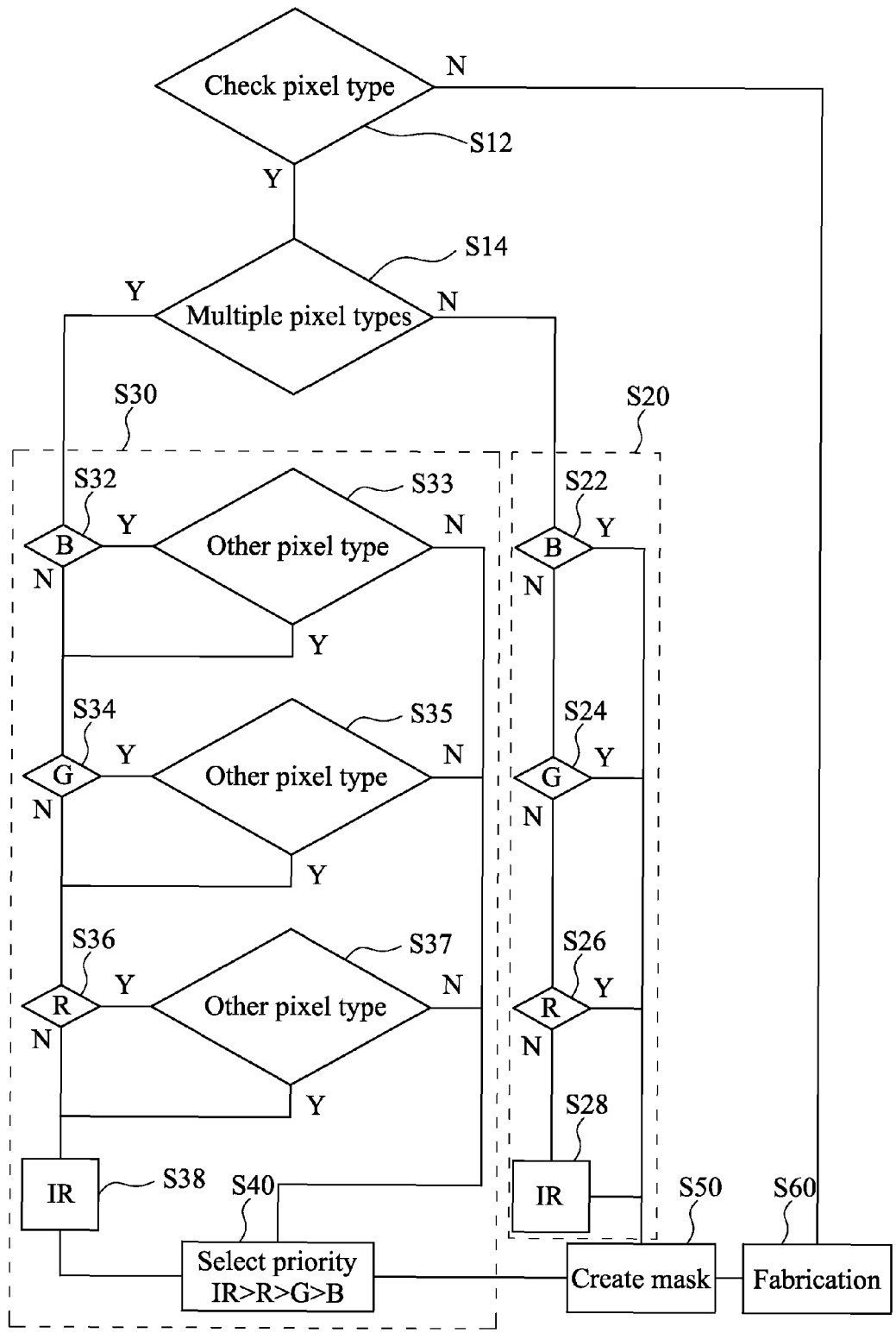
FIG. 6 is a flow chart of a method for determining a size of the microstructures in accordance with various embodiments of the present disclosure.

FIG. 5 is an enlarged cross-sectional view of microstructures 126 in accordance with various embodiments of the present disclosure, and FIG. 6 is a flow chart of a method for determining a size of the microstructures 126 in accordance with various embodiments of the present disclosure. Different photodetectors correspond to different sizes of the microstructures 126. For example, the size of the microstructures 126 corresponding to the infrared photodetector 140IR (see FIG. 1F) is larger than the size of the microstructures 126 corresponding to the red photodetector 140R (see FIG. 1F). Hence, the size of the microstructures 126 is determined before the microstructures 126 are formed. In FIG. 5, the size of the microstructures 126 includes a height H and a width W. The height H is a protrude distance of the microstructure 126, and the width W is a distance between the peaks of two adjacent microstructures 126.

To determine the size of the microstructures 126, determine if the pixel (or the photodetector) type(s) of a semiconductor device is checked, as shown in operation S12. If no, then fabricate the semiconductor device directly, as shown in operation S60. If yes, check if the semiconductor device has multiple pixel types (such as photodetectors with different colors), as shown in operation S14. If no, then check whether the pixel type of the semiconductor device is, as shown in operation S20. For example, check if the pixel type is blue pixel B (operation S22), green pixel G (operation S24), red pixel R (operation S26), or infrared pixel IR (operation S28) in sequence. Once the pixel type is determined, the size of the microstrctures 126 is determined, such that the mask of the microstructures 126 (or 116) can be created, as shown in operation S50. Subsequently, the semiconductor device can be fabricated, as shown in operation S60.

On the other hand, if the semiconductor device has multiple pixel types, then check the pixel types of the semiconductor device, as shown in operation S30. For example, check if there is a blue pixel B in the semiconductor device (operation S32). If no, then check if there is a green pixel G therein (operation S34); or if yes, then check if there is another pixel type, as shown in operation S33. If there is another pixel type, then further check if there is a green pixel G (operation S34), a red pixel R (operation S36), and/or an infrared pixel IR (operation S38). Furthermore, once one type of the pixel is checked, check if there is another pixel type (operations S33, S35, and S37). After the pixel types are determined, select the priority thereof, as shown in operation S40. For example, the priority is IR>R>G>B. That is, if there is an infrared pixel in the semiconductor device, the size of all the microstructures 126 corresponds to the infrared pixel even though there may be another pixel type (for example, the red pixel) in the semiconductor device. If there is a red pixel in the semiconductor device but no infrared pixel therein, the size of all the microstructures 126 corresponds to the red pixel instead. Once the size of the microstructures 126 is determined, the mask of the microstructures 126 (or 116) can be created, as shown in operation S50. Subsequently, the semiconductor device can be fabricated, as shown in operation S60.

In order to enhance intensity of light incident at least one of the photodetectors (especially the infrared photodetector and the red photodetector), a light enhancement structure is disposed between the carrier substrate and the color filters and adjacent to the photodetectors. Therefore, the light enhancement structure can redirect light to at least one of the photodetectors through reflection.

According to some embodiments of the present disclosure, a semiconductor device includes a carrier substrate, a first color filter, a first photodetector, and a light enhancement structure. The first photodetector is disposed between the carrier substrate and the first color filter. The light enhancement structure is disposed between the first color filter and the carrier substrate and adjacent to the first photodetector for enhancing intensity of light incident the first photodetector.

According to some embodiments of the present disclosure, a semiconductor device includes a carrier substrate, a first color filter, a first photodetector, and a light enhancement structure. The first photodetector is disposed between the carrier substrate and the first color filter. The light enhancement structure is disposed between the first color filter and the carrier substrate and adjacent to the first photodetector for redirecting light to the first photodetector through reflection.

According to some embodiments of the present disclosure, a method for manufacturing a semiconductor device includes forming a first photodetector on or above a carrier substrate. A first color filter is formed on or above the first photodetector. A light enhancement structure is formed between the carrier substrate and the first color filter and adjacent to the first photodetector for enhancing intensity of light incident the first photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a carrier substrate;
   a first color filter;
   a second color filter, wherein a transmission wavelength range of the first color filter is longer than a transmission wavelength range of the second color filter;
   a first photodetector disposed between the carrier substrate and the first color filter;
   a second photodetector disposed between the carrier substrate and the second color filter;
   a plurality of first microstructures disposed between the first color filter and the carrier substrate and adjacent to the first photodetector for enhancing intensity of light incident on the first photodetector, wherein the first microstructures are present on a surface of the first photodetector; and
   a dielectric layer disposed between the second color filter and the carrier substrate and having a substantially flat surface in contact with the second photodetector, wherein the dielectric layer and the first microstructures are integrally formed.

2. The semiconductor device of claim 1, wherein the first microstructures are disposed between the carrier substrate and the first photodetector.

3. The semiconductor device of claim 2, further comprising:
   an active element disposed between the first color filter and the first photodetector.

4. The semiconductor device of claim 1, wherein the first microstructures are disposed between the first photodetector and the first color filter.

5. The semiconductor device of claim 4, further comprising:
   an active element disposed between the first photodetector and the carrier substrate.

6. The semiconductor device of claim 1, wherein a surface of the second photodetector facing the dielectric layer is substantially flat, and the first photodetector comprises a plurality of second microstructures in contact with the first microstructures.

7. The semiconductor device of claim 6, wherein the second microstructures are cone-shaped.

8. The semiconductor device of claim 1, wherein the first microstructures are cone-shaped.

9. A semiconductor device, comprising:
   a carrier substrate;
   a first color filter;
   a second color filter, wherein a transmission wavelength range of the first color filter is longer than a transmission wavelength range of the second color filter;
   a first photodetector disposed between the carrier substrate and the first color filter;
   a second photodetector disposed between the carrier substrate and the second color filter;
   a plurality of first microstructures disposed between the first color filter and the carrier substrate and adjacent to the first photodetector for redirecting light to the first photodetector through reflection, wherein the first microstructures are present on a surface of the first photodetector; and
   a dielectric layer in contact with the first microstructures, disposed between the second color filter and the carrier substrate, and having a substantially flat surface in contact with the second photodetector.

10. The semiconductor device of claim 9, wherein the first microstructures are disposed between the carrier substrate and the first photodetector.

11. The semiconductor device of claim 10, further comprising an active element disposed between the first color filter and the first photodetector.

12. The semiconductor device of claim 9, wherein a surface of the second photodetector facing the dielectric layer is substantially flat, and the first photodetector comprises a plurality of second microstructures in contact with the first microstructures.

13. The semiconductor device of claim 12, wherein the second microstructures are cone-shaped.

14. The semiconductor device of claim 9, wherein the first microstructures are cone-shaped.

15. A method for manufacturing a semiconductor device, comprising:
   forming a first photodetector and a second photodetector on or above a carrier substrate;
   forming a first color filter on or above the first photodetector and a second color filter on or above the second photodetector, wherein a transmission wavelength range of the first color filter is longer than a transmission wavelength range of the second color filter; and
   forming a dielectric layer between the second color filter and the carrier substrate and adjacent to the second photodetector and a plurality of microstructures between the first color filter and the carrier substrate and on a surface of the first photodetector for enhancing intensity of light incident on the first photodetector, wherein the dielectric layer has a substantially flat surface in contact with the second photodetector, and the dielectric layer and the microstructures are integrally formed.

16. The method of claim 15, wherein the forming the dielectric layer and the plurality of microstructures further comprises:
   determining a size of the microstructures.

17. The method of claim 15, wherein the forming the dielectric layer and the plurality of microstructures comprises:
   forming the plurality of microstructures between the carrier substrate and the first photodetector.

18. The method of claim 15, further comprising:
   forming an active element between the first color filter and the first photodetector.

19. The method of claim 15, wherein the forming the dielectric layer and the plurality of microstructures comprises:

forming the plurality of microstructures between the first color filter and the first photodetector.

20. The method of claim 19, further comprising:
forming an active elements between the first photodetector and the carrier substrate.

* * * * *